United States Patent
Kord et al.

(10) Patent No.: US 12,531,532 B2
(45) Date of Patent: Jan. 20, 2026

(54) RF AMPLIFIER OF ACCURATE BIAS AND HEALTHY HEADROOM AND METHOD THEREOF

(71) Applicant: Realtek Semiconductor Corp., Hsinchu (TW)

(72) Inventors: Ahmed Kord, San Diego, CA (US); Chia-Liang (Leon) Lin, Fremont, CA (US)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 572 days.

(21) Appl. No.: 18/057,243

(22) Filed: Nov. 21, 2022

(65) Prior Publication Data

US 2024/0171142 A1    May 23, 2024

(51) Int. Cl.
*H03F 3/45*    (2006.01)
*H03F 1/22*    (2006.01)
*H03F 3/195*   (2006.01)

(52) U.S. Cl.
CPC ......... *H03F 3/45475* (2013.01); *H03F 1/223* (2013.01); *H03F 3/195* (2013.01);
(Continued)

(58) Field of Classification Search
CPC ........... H03F 3/45475; H03F 2200/451; H03F 3/195; H03F 2203/45024; H03F 3/245; H03F 1/223; H03F 1/56
(Continued)

(56) References Cited

U.S. PATENT DOCUMENTS 5,373,228 A * 12/1994 Holle .................. G05F 3/262
                                                      330/288
6,333,677 B1   12/2001 Dening
(Continued)

FOREIGN PATENT DOCUMENTS

CN    100383691 C  *  4/2008
CN    104883780 A  *  9/2015 ........... H04B 7/2656
(Continued)

OTHER PUBLICATIONS

TW Office Action dated Jun. 6, 2024 in Taiwan application No. 112128713.

*Primary Examiner* — Andrea Lindgren Baltzell
*Assistant Examiner* — Lance Torbjorn Bartol
(74) *Attorney, Agent, or Firm* — McClure, Qualey & Rodack, LLP

(57) ABSTRACT

A method operates to bias an RF receiver by incorporating a first NMOSFET as a common-source amplifier; incorporating a second NMOSFET as a cascode device stacked upon the first NMOSFET, injecting a reference current into a drain of a third NMOSFET; using a first operational amplifier to generate a first bias voltage to control a gate of the first NMOSFET, a gate of the third NMOSFET, and a gate of a fourth NMOSFET in accordance with a voltage difference between the drain of the third NMOSFET and a drain of the fourth NMOSFET; incorporating a fifth NMOSFET stacked upon the fourth NMOSFET; and using a second operational amplifier to generate a second bias voltage to control a gate of the second NMOSFET and a gate of the fifth NMOSFET in accordance with a voltage difference between a reference voltage and the drain of the fourth NMOSFET.

13 Claims, 3 Drawing Sheets

(52) U.S. Cl.
CPC ............... *H03F 2200/451* (2013.01); *H03F 2203/45024* (2013.01)

(58) Field of Classification Search
USPC ........................................... 330/261
See application file for complete search history.

(56) References Cited

U.S. PATENT DOCUMENTS

2010/0085119 A1\* 4/2010 Samavedam ........... H03F 1/301
330/285
2016/0301370 A1\* 10/2016 Zhu ..................... H03F 1/0205

FOREIGN PATENT DOCUMENTS

| EP | 1081573 A1 \* | 3/2001 | ............. G05F 3/205 |
| EP | 3468034 B1 | 4/2022 | |
| WO | WO-0020942 A1 \* | 4/2000 | ............. G05F 3/262 |

\* cited by examiner

RF AMPLIFIER OF ACCURATE BIAS AND HEALTHY HEADROOM AND METHOD THEREOF

BACKGROUND OF THE DISCLOSURE

Field of the Disclosure

The present disclosure generally relates to RF (radio frequency) amplifier and particularly to RF amplifiers and methods providing accurate bias and healthy headroom under PVT (process, voltage, temperature) variation.

Description of Related Art

An RF (radio frequency) amplifier receives an input signal from an input network and outputs an output signal to a load network. In an exemplary process, the RF amplifier is fabricated on a silicon substrate using a CMOS (complementary metal oxide semiconductor) process technology. Specifications of interest of the RF amplifier include gain, reverse isolation, frequency response, return loss, noise figure, linearity, and power consumption. To provide an adequate gain, the RF amplifier needs to have a gain device that is usually configured in a common-source amplifier topology and usually stacked with a cascode device to improve frequency response and reverse isolation. Gain and linearity are both strongly dependent on a bias condition of the gain device and the cascode device, if applicable. Return loss and noise figure are usually dependent on impedance matching in addition to the bias condition. There is a tradeoff between power consumption and noise figure. In any case, bias condition is a key factor that affects performance related to most, if not all, specifications. Performance of circuits fabricated using CMOS process technology is subject to vary widely under PVT (process, voltage, and temperature) variation, and it is mostly due to variation in bias condition. A prior art RF amplifier of a common-source amplifier topology uses a first NMOSFET (n-channel metal oxide semiconductor field effect transistor) configured in a diode-connect topology to convert a reference current into a first bias voltage that is used to determine a gate voltage of a gain device embodied by a second NMOSFET. This generally belongs to a biasing technique known as "current mirroring," wherein the reference current is mirrored into a quiescent DC current of the gain device with a scaling factor determined by width-to-length ratios of the first NMOSFET and the second NMOSFET.

In addition, a second bias voltage is derived by applying an offset to the first bias voltage and used to determine a gate voltage of a cascode device embodied by a third NMOSFET that is stacked upon the second NMOSFET. There are a few issues that need to be addressed. First, accuracy of the current mirroring is subject to degradation due to channel length modulation of the second NMOSFET. To achieve a high bandwidth, the second NMOSFET usually must have a short channel length, and this leads to a pronounced channel length modulation and thus inaccuracy in a bias current of the gain device. Second, both the second NMOSFET and the third NMOSFET must maintain ample headroom under PVT variation to ensure good linearity. Due to the stack-up topology, this is usually difficult to achieve, especially in a low-supply voltage application wherein the available headroom is highly limited and one of the second NMOSFET and the third NMOSFET can be easily crushed in a presence of a large input signal.

What is desired is an RF amplifier of a bias scheme that can have an accurate bias current and can maintain healthy headroom usage under PVT variation.

BRIEF DESCRIPTION OF THIS DISCLOSURE

A first objective of the invention of this disclosure is to establish an accurate bias current for a RF (radio frequency) amplifier despite PVT (process, voltage, and temperature) variation.

A second objective of the invention of this disclosure is to establish a robust biasing condition that can maintain healthy headroom for a RF amplifier despite PVT variation.

In an embodiment, a RF amplifier comprises: a cascode amplifier comprising a stack up of an input device comprising a first NMOSFET (n-channel metal oxide semiconductor field effect transistor) biased by a first bias voltage and a cascode device comprising a second NMOSFET biased by a second bias voltage; a load network comprising a load inductor configured to couple a power supply node to a drain of the second NMOSFET; and a bias generation network configured to generate the first bias voltage and the second bias voltage in accordance with a reference current and a reference voltage, the bias generation network comprising a third NMOSFET, a fourth NMOSFET, a fifth NMOSFET, a first operational amplifier, and a second operational amplifier, wherein: the reference current injects into a drain of the third NMOSFET; the first operational amplifier outputs the first bias voltage to control both a gate of the third NMOSFET and a gate of the fourth NMOSFET in accordance with a voltage difference between the drain of the third NMOSFET and either a drain of the fourth NMOSFET or the reference voltage; the fifth NMOSFET is stacked upon the fourth NMOSFET in the same way as that the second NMOSFET is stacked upon the first NMOSFET; the second operational amplifier outputs the second bias voltage to control a gate of the fifth NMOSFET in accordance with a voltage difference between the reference voltage and the drain of the fourth NMOSFET; and a drain of the fifth NMOSFET connects to the power supply node.

In an embodiment, a method comprises: incorporating a cascode amplifier comprising a second NMOSFET stacked upon a first NMOSFET; incorporating a fifth NMOSFET stacked upon a fourth NMOSFET in the same way as the second NMOSFET is stacked upon the first NMOSFET; injecting a reference current into a drain of a third NMOSFET; configuring the third NMOSFET and the fourth NMOSFET to be a current mirror by using a first bias voltage to control both a gate of the third NMOSFET and a gate of the fourth NMOSFET; establishing the first bias voltage in accordance with a voltage difference between the drain of the third NMOSFET and either a drain of the fourth NMOSFET or a reference voltage using a first operational amplifier; establishing a second bias voltage to control a gate of the fifth NMOSFET in accordance with the voltage difference between a reference voltage and the drain of the fourth NMOSFET; using the first bias voltage to control a gate of the first NMOSFET; using the second bias voltage to control a gate of the second NMOSFET; connecting a drain of the fifth NMOSFET to a power supply node; and connecting a drain of the second NMOSFET to the power supply node via a load inductor.

In an embodiment, a method comprises: incorporating a first NMOSFET as a common-source amplifier; incorporating a second NMOSFET as a cascode device stacked upon the first NMOSFET, wherein a source of the second NMOSFET connects to a drain of the first NMOSFET and a drain of the second NMOSFET connects to a power supply node via a load inductor; injecting a reference current into a drain of a third NMOSFET; using a first operational amplifier to generate a first bias voltage to control a gate of the first NMOSFET, a gate of the third NMOSFET, and a gate of a fourth NMOSFET in accordance with a voltage difference between the drain of the third NMOSFET and either a drain of the fourth NMOSFET or a reference voltage; incorporating a fifth NMOSFET stacked upon the fourth NMOSFET, wherein a source of the fifth NMOSFET connects to the drain of the fourth NMOSFET and a drain of the fifth NMOSFET connects to the power supply node; and using a second operational amplifier to generate a second bias voltage to control both a gate of the second NMOSFET and a gate of the fifth NMOSFET in accordance with a voltage difference between the reference voltage and the drain of the fourth NMOSFET.

DETAILED DESCRIPTION OF THIS DISCLOSURE

Figure 1:
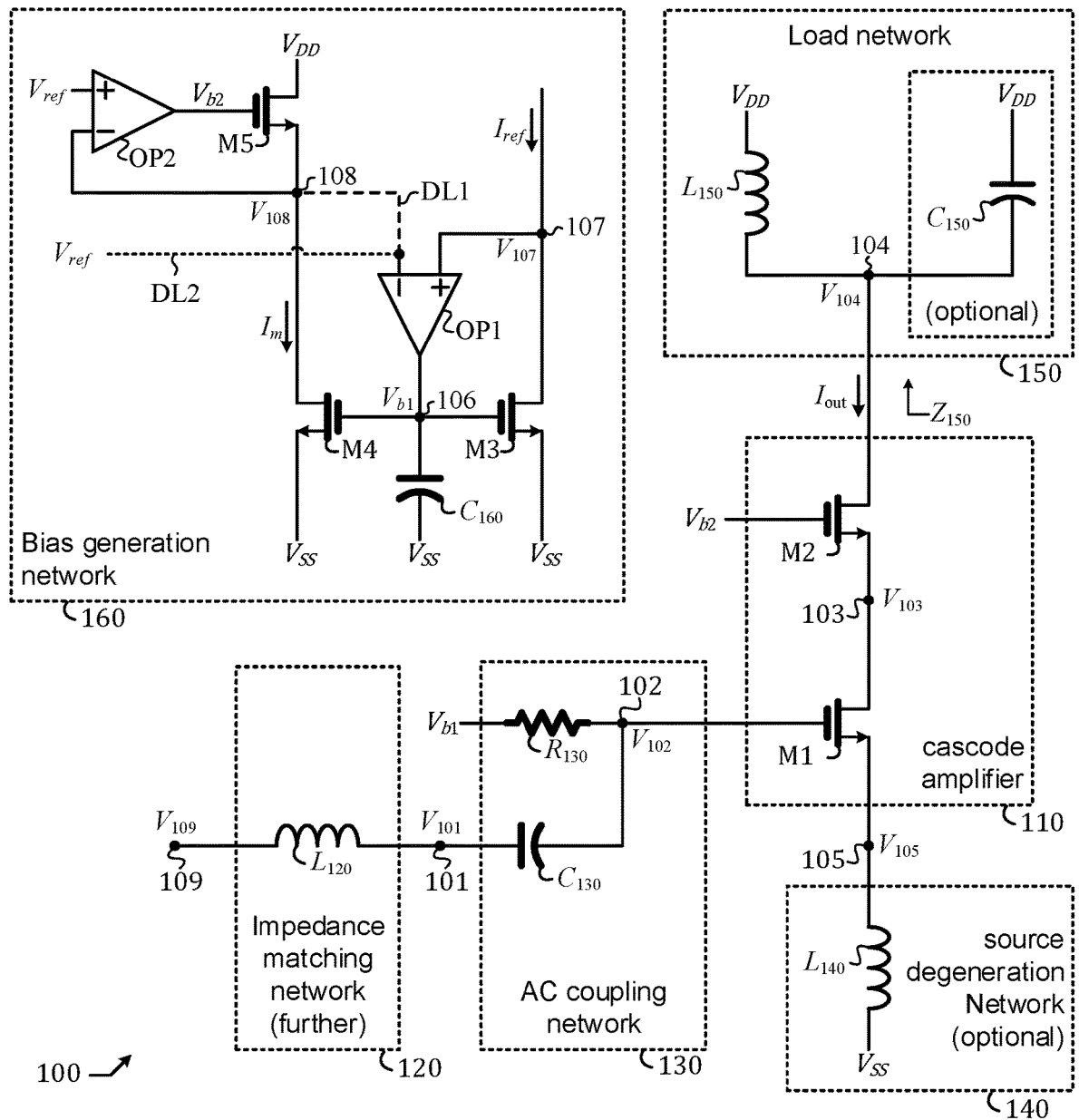
FIG. 1 shows a schematic diagram of a RF amplifier in accordance with an embodiment of the present disclosure.

The present disclosure is directed to RF amplifiers. While the specification describes several example embodiments considered favorable modes of practicing the invention, it should be understood that the invention can be implemented in many ways and is not limited to the particular examples described below or to the particular manner in which any features of such examples are implemented. In other instances, well-known details are not shown or described to avoid obscuring aspects of the disclosure.

Persons of ordinary skill in the art understand terms and basic concepts related to microelectronics that are used in this disclosure, such as "voltage," "current," "circuit node," "signal," "power supply," "ground," "bias voltage," "DC (direct current)," "AC (alternate current)," "NMOSFET (n-channel metal oxide semiconductor field effect transistor)," "PMOSFET (p-channel metal oxide semiconductor field effect transistor)," "current mirror," "current source," "operational amplifier," "common-source amplifier," "cascode," and "impedance." Terms like these are used in a context of microelectronics, and the associated concepts are apparent to those of ordinary skills in the art and thus will not be explained in detail in this disclosure.

A circuit is a collection of a transistor, a capacitor, a resistor, and/or other electronic devices inter-connected in a certain manner to embody a certain function.

A network is a circuit or a collection of circuits configured to embody a certain function.

In this present disclosure, a "circuit node" is simply referred to as a "node" for short, as the meaning is clear from a context of microelectronics.

Those of ordinary skill in the art can recognize a resistor symbol, a capacitor symbol, an inductor symbol, and a MOSFET (metal-oxide semiconductor field effect transistor) symbol, for both PMOSFET and NMOSFET, in a schematic diagram. A MOSFET has a source terminal, a gate terminal, and a drain terminal, all of which those of ordinary skill in the art can easily identify. Pertaining to a MOSFET, in this present disclosure, a source terminal, a gate terminal, and a drain terminal are simply referred to as "source," "gate," and "drain," for short, without causing confusion in a context of microelectronics.

Those of ordinary skills in the art can read schematics of a circuit comprising resistors, capacitors, NMOSFET, and PMOSFET, and do not need a verbose description about how one transistor, resistor, or capacitor connects with another in the schematics.

This present disclosure is disclosed in terms of an engineering sense. For instance, regarding two variables X and Y, when it is said that "X is equal to Y," it means that "X is approximately equal to Y," i.e., "a difference between X and Y is smaller than a specified engineering tolerance." When it is said that "X is zero," it means that "X is approximately zero," i.e., "X is smaller than a specified engineering tolerance." When it is said that "X is substantially smaller than Y," it means that "X is negligible with respect to Y," i.e., "a ratio between X and Y is smaller than an engineering tolerance and therefore X is negligible when compared to Y."

Throughout this disclosure, "$V_{DD}$" denotes a power supply node, and "$V_{SS}$" denotes a ground node. Note that a ground node is a node at which a voltage level is substantially zero, and a power supply node is a node at which a voltage level is substantially stationary and higher than zero.

In this present disclosure, a signal is a voltage or a current of a variable level that can vary with time. A (voltage or current) level of a signal at a moment represents a state of the signal at that moment.

A schematic diagram of a RF amplifier 100 in accordance with an embodiment of the present disclosure in shown in FIG. 1. RF amplifier 100 comprises an AC (alternate-current) coupling network 130, a cascode amplifier 110, a load network 150, and a bias generation network 160. Throughout this disclosure, "$V_{DD}$" denotes a power supply node and "$V_{SS}$" denotes a ground node. The AC coupling network 130 comprises an AC coupling capacitor $C_{130}$ configured to provide AC coupling between a voltage $V_{101}$ at a first node 101 and a voltage $V_{102}$ at a second node 102, and a DC coupling resistor 8130 configured to provide DC (direct current) coupling between a first bias voltage $V_{b1}$ and the voltage $V_{102}$. Cascode amplifier 110 comprises an input device embodied by a first NMOSFET (n-channel metal oxide semiconductor field effect transistor) M1 and a cascode device embodied by a second NMOSFET M2 that is stacked upon M1, wherein a drain of M1 connects to a source of M2 at a third node 103, and is configured to receive a voltage V 102 at the second node 102 and output an output current $I_{out}$ to a fourth node 104 to establish a voltage V 104.

It should be noted that current flow direction and signal propagation direction are different things. In terms of current flow, $I_{out}$ flows from the fourth node 104 into the cascode amplifier 110. In terms of signal propagation, however, it's the cascode amplifier 110 that initiates and dictates $I_{out}$, while the fourth node 104 and the voltage thereof $V_{104}$ respond passively. That is why it is said that the cascode amplifier 110 outputs $I_{out}$ to the fourth node 104, albeit $I_{out}$ flows from the fourth node 104 into the cascode amplifier 110.

Load network 150, which includes a load inductor L 150, provides DC coupling between the power supply node $V_{DD}$ and a voltage V 104 at the fourth node 104; DC wise, V 104 is effectively shorted to $V_{DD}$. A source of M1 connects to a fifth node 105. In an optional embodiment, RF amplifier 100 further comprises a source degeneration network 140 comprising a source inductor L 140 configured to provide DC coupling between the ground node $V_{SS}$ and the fifth node 105; in this case, DC wise, a voltage V 105 at the fifth node 105 is shorted to $V_{SS}$. In an alternative embodiment, the source inductor L 140 is replaced by a short circuit so that V 105 is outright shorted to $V_{SS}$.

The bias generation network comprises a third NMOSFET M3, a fourth NMOSFET M4, a fifth NMOSFET M5, a first operational amplifier OP1, and a second operational amplifier OP2. A reference current I_ref injects into a drain of M3. M3 and M4 form a current mirror, wherein a gate of M3 is connected to a gate of M4 at a sixth node 106, and a drain current I_m of M4 is equal to the reference current I_ref times a scaling factor that depends on width-to-length ratios of M3 and M4. An objective of the bias generation network is to ensure that M3 and M4 can form a very accurate current mirror despite channel length modulation; this is achieved by using a negative feedback loop. In a negative feedback loop comprising an operational amplifier of a sufficiently large gain, a voltage at a positive input terminal ("+") and a voltage at a negative input terminal ("−") will be adjusted and made equal. In a first embodiment wherein a first dashed line DL1 is a solid connection while a second dashed line DL2 is broken, OP1 outputs the first bias voltage V_b1 to the sixth node 106 to control both the gate of M3 and the gate of M4 in accordance with a voltage difference between a voltage V_107 at a seventh node 107 and a voltage V_108 at an eighth node 108, wherein the drain of M3 and the drain of M4 connect to the seventh node 107 and the eighth node 108, respectively. M4 and M5 mimic M1 and M2 in a cascode topology: like M1, M4 is an input device; and like M2, M5 is a cascode device that is stacked upon M4, wherein a source of M5 connects to the drain of M4 and a drain of M5 connects to V_DD. OP2 generates a second bias voltage V_b2 to control both a gate of M5 and a gate of M2 in accordance with a voltage difference between a reference voltage V_ref and V_108. OP2 and M5 forms a first negative feedback loop to force V_108 (which is the voltage at the "−" terminal of OP2) to be equal to V_ref (which is the voltage at the "+" terminal of OP2), provided a gain of OP2 is sufficiently large. OP1 and M3 forms a second negative feedback loop to force V_107 (which is the voltage at the "+" terminal of OP1) to be equal to V_108 (which is the voltage at the "−" terminal of OP1), and thus equal to V_ref, provided a gain of OP1 is sufficiently large.

In a second embodiment, wherein the second dashed line DL2 is a solid connection while the first dashed line DL1 is broken, OP1 outputs the first bias voltage $V_{b1}$ to the sixth node 106 to control both the gate of M3 and the gate of M4 in accordance with a voltage difference between $V_{107}$ and $V_{ref}$. In this case, the second negative feedback loop will force $V_{107}$ (which is the voltage at the "+" terminal of OP1) to be equal to $V_{ref}$, while the first negative feedback loop will still force $V_{108}$ to be equal to $V_{ref}$ (which is the voltage at the "−" terminal of OP1). As such, $V_{107}$ will still be forced to be equal to $V_{108}$. In summary, the negative input terminal ("−") of OP1 can connect to either $V_{108}$ (in the first embodiment) or $V_{ref}$ (in the second embodiment), but the result is the same: $V_{107}$ will be equal to $V_{108}$, so that a channel modulation effect of M3 can be the same as a channel modulation effect of M4, resulting in a highly accurate current mirroring from $I_{ref}$ to $I_m$.

Bias generation network 160 further comprises a compensation capacitor $C_{160}$ configured to shunt the sixth node 106 to the ground node $V_{SS}$ to provide a frequency compensation that can improve stability of the second negative feedback loop. In a further embodiment not shown in the figure but clear to those of ordinary skill in the art, bias generation network 160 further comprises a serial resistor that is inserted between the sixth node 106 and the compensation capacitor $C_{160}$. Concepts of stability and frequency compensation regarding a negative feedback loop are well understood by those of ordinary skill in the art and thus not described in detail here. Those skilled in the art can choose to use a frequency compensation scheme at their discretion and do not necessarily need to use the same circuit shown in the bias generation network 160.

Let width-to-length ratios of M1, M2, M3, M4, and M5 be $W_1/L_1$, $W_2/L_2$, $W_3/L_3$, $W_4/L_4$, and $W_5/L_5$, respectively. Let a scaling factor from $W_3/L_3$ to $W_4/L_4$ be $\beta_1$, and a scaling factor from $W_4/L_4$ to $W_1/L_1$ be $\beta_2$, i.e., $$\beta_1 \equiv (W_4/L_4)/(W_3/L_3) \tag{1}$$

$$\beta_2 \equiv (W_1/L_1)/(W_4/L_4) \tag{2}$$

The scaling factor from $W_5/L_5$ to $W_2/L_2$ is the same as the scaling factor from $W_4/L_4$ to $W_1/L_1\beta_2$, i.e., $$\beta_2 = (W_2/L_2)/(W_5/L_5) \tag{3}$$

M3 and M4 have the same gate voltage ($V_{b1}$), the same drain voltage (thanks to the second negative feedback loop), and the same source voltage ($V_{SS}$), therefore $I_{ref}$ is accurately mirrored into $I_m$ with a scaling factor determined by $(W_4/L_4)/(W_3/L_3)$. From equation (1), we obtain $$I_m = \beta_1 I_{ref} \tag{4}$$

In a static condition, M1 and M4 have the same gate voltage ($V_{b1}$) and the same source voltage ($V_{SS}$), M2 and M5 have the same gate voltage ($V_{b2}$) and the same drain voltage ($V_{DD}$), and the scaling factor (of the width-to-length ratio) from M4 to M1 is the same as the scaling factor (of the width-to-length ratio) from M5 to M2. This demands a voltage $V_{103}$ at the third node 103 must be equal to the voltage $V_{108}$ at the eighth node 108; i.e., a DC voltage of $V_{103}$ must be equal to $V_{ref}$. As such, the output current $I_{out}$ is scaled from the mirrored current $I_m$ by the factor $\beta_2$, i.e., $$I_{out} = \beta_2 I_m \tag{5}$$

From, equations (4) and (5), we have $$I_{out} = \beta_1 \beta_2 I_{ref} \tag{6}$$

The output current of cascode amplifier 110, therefore, can be highly accurate, thanks to using the bias generation network 160 comprising two negative feedback loops along with a proper scaling of width-to-length ratios of devices. The accuracy relies on merits of negative feedback loops and device matching and can be highly insensitive to PVT variation. This fulfills a first objective of the present disclosure.

A drain-to-source voltage of M1 is $V_{ref}$ and a drain-to-source voltage of M2 is $V_{DD}-V_{ref}$; both can be accurate and insensitive to process and temperature variation. It is inevitable, however, that a headroom of cascode amplifier 110 is dependent upon and thus limited by $V_{DD}$, since a sum of the drain-to-source voltage of M1 and the drain-to-source voltage of M2 must be equal to $V_{DD}$. Nevertheless, the headroom can be optimized if $V_{ref}$ tracks $V_{DD}$; in this case, the drain-to-source voltages of M1 and M2 both track $V_{DD}$, and an adverse impact of headroom reduction due to a drop of $V_{DD}$ can be alleviated by distributing the reduction between M1 and M2. This fulfills a second objective of the present disclosure, that a healthy headroom can be maintained despite PVT variation.

In an embodiment, $V_{ref}$ is derived from $V_{DD}$ by using a resistive voltage divider that divides $V_{DD}$ into $V_{ref}$, wherein two resistors are connected in series and inserted between $V_{DD}$ and $V_{SS}$, and $V_{ref}$ is tapped at a connection point of the two resistors. The cascode device embodied by M2 usually provides a voltage gain (so that a swing of $V_{104}$ is greater than a swing of $V_{103}$), it is advantageous to allocate more headroom to M2 than M1. Therefore, in an embodiment, $V_{ref}$ is lower than half $V_{DD}$.

In a further embodiment, the RF amplifier 100 further comprises an impedance matching network 120 comprising a serial inductor L_120 and configured to provide impedance matching between the first node 101 and a ninth node 109; in this case, an input of the RF amplifier 100 is a voltage V_109 at the ninth node 109, instead of a voltage V_101 at the first node 101. Concept of impedance matching is well understood by those of ordinary skill in the art and thus not explained in detail.

Source degeneration network 140, which comprises the source inductor $L_{140}$, is also used to provide impedance matching. Using a source inductor to provide impedance matching is well known in the prior art and thus not described in detail here. In an embodiment, the source inductor $L_{140}$ comprises a metal trace. In an, the source inductor $L_{140}$ comprises a bonding wire of a package.

In an optional embodiment, the load network 150 further comprises a load capacitor $C_{150}$ that is connected to the load inductor $L_{150}$ in parallel to form a resonant network to boost a load impedance $Z_{150}$ at a frequency of interest. Concepts of "resonant network" and "impedance" are well understood by those of ordinary skill in the art and thus not described in detail here. In an embodiment, the load capacitor $C_{150}$ comprises a parasitic capacitor.

Operational amplifiers are well known in the prior art. Those skilled in the art can freely choose a suitable circuit implementation known in the prior art to embody OP1 and OP2 at their discretion.

Figure 2:
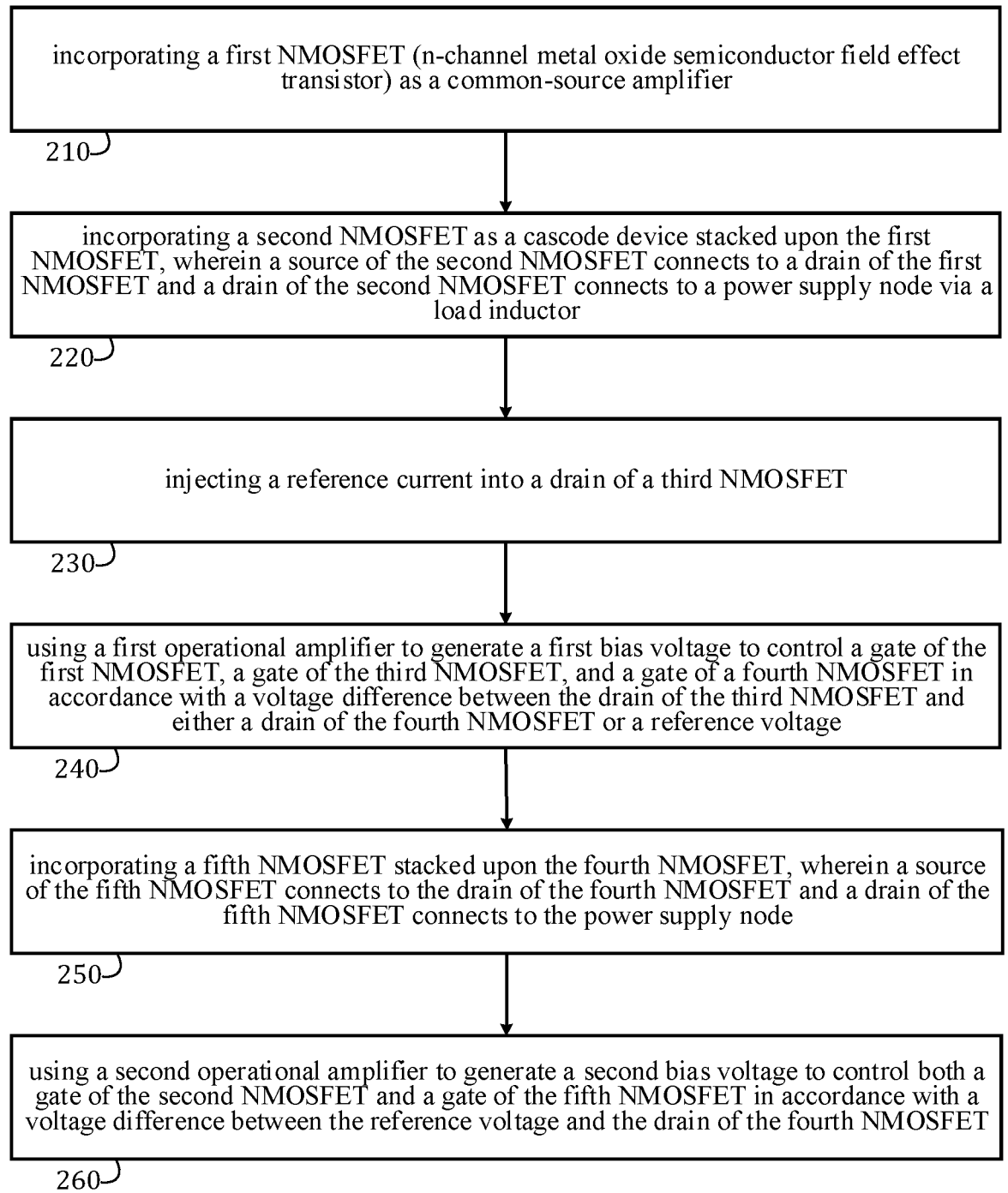
FIG. 2 shows a flow diagram of a method in accordance with an embodiment of the present disclosure.

As illustrated by a flow diagram shown in FIG. 2, a method in accordance with the present disclosure comprises: (step 210) incorporating a first NMOSFET (n-channel metal oxide semiconductor field effect transistor) as a common-source amplifier; (step 220) incorporating a second NMOSFET as a cascode device stacked upon the first NMOSFET, wherein a source of the second NMOSFET connects to a drain of the first NMOSFET and a drain of the second NMOSFET connects to a power supply node via a load inductor; (step 230) injecting a reference current into a drain of a third NMOSFET; (step 240) using a first operational amplifier to generate a first bias voltage to control a gate of the first NMOSFET, a gate of the third NMOSFET, and a gate of a fourth NMOSFET in accordance with a voltage difference between the drain of the third NMOSFET and either a drain of the fourth NMOSFET or a reference voltage; (step 250) incorporating a fifth NMOSFET stacked upon the fourth NMOSFET, wherein a source of the fifth NMOSFET connects to the drain of the fourth NMOSFET and a drain of the fifth NMOSFET connects to the power supply node; and (step 260) using a second operational amplifier to generate a second bias voltage to control both a gate of the second NMOSFET and a gate of the fifth NMOSFET in accordance with a voltage difference between the reference voltage and the drain of the fourth NMOSFET.

Figure 3:
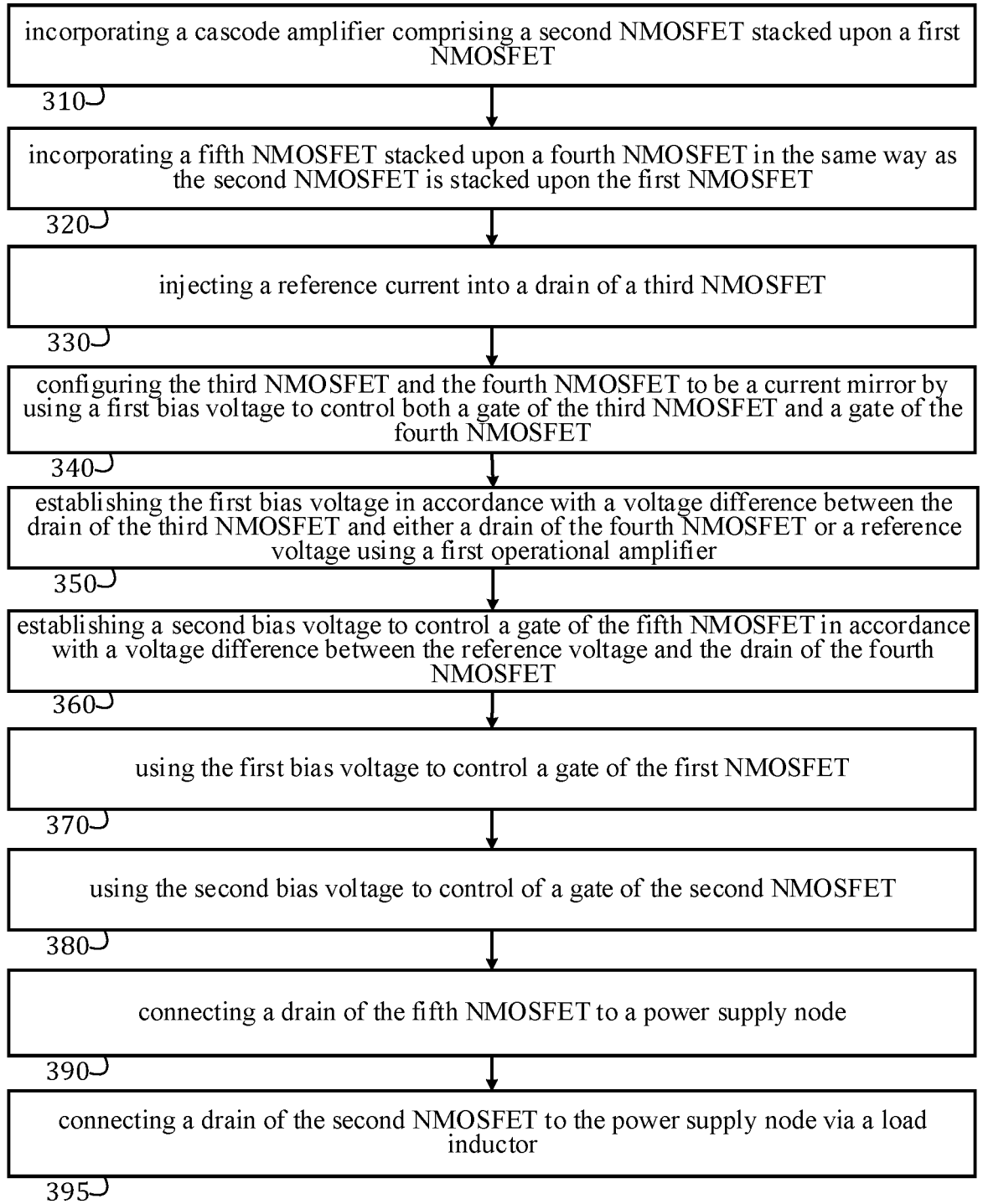
FIG. 3 shows another flow diagram of a method in accordance with an embodiment of the present disclosure.

As illustrated by a flow diagram shown in FIG. 3, a method in accordance with the present disclosure comprises: (step 310) incorporating a cascode amplifier comprising a second NMOSFET stacked upon a first NMOSFET; (step 320) incorporating a fifth NMOSFET stacked upon a fourth NMOSFET in the same way as the second NMOSFET is stacked upon the first NMOSFET; (step 330) injecting a reference current into a drain of a third NMOSFET; (step 340) configuring the third NMOSFET and the fourth NMOSFET to be a current mirror by using a first bias voltage to control both a gate of the third NMOSFET and a gate of the fourth NMOSFET; (step 350) establishing the first bias voltage in accordance with a voltage difference between the drain of the third NMOSFET and either a drain of the fourth NMOSFET or a reference voltage using a first operational amplifier; (step 360) establishing a second bias voltage to control a gate of the fifth NMOSFET in accordance with a voltage difference between the reference voltage and the drain of the fourth NMOSFET; (step 370) using the first bias voltage to control a gate of the first NMOSFET; (step 380) using the second bias voltage to control of a gate of the second NMOSFET; (step 390) connecting a drain of the fifth NMOSFET to a power supply node; and (step 395) connecting a drain of the second NMOSFET to the power supply node via a load inductor.

Those skilled in the art will readily observe that numerous modifications and alterations of the device and method may be made while retaining the teachings of the disclosure. Accordingly, the above disclosure should not be construed as limited only by the metes and bounds of the appended claims.

What is claimed is:

1. An RF amplifier comprising:
   a cascode amplifier comprising a stack up of a first NMOSFET (n-channel metal oxide semiconductor field effect transistor) biased by a first bias voltage and a second NMOSFET biased by a second bias voltage;
   a load network comprising a load inductor configured to couple a power supply node to a drain of the second NMOSFET; and
   a bias generation network configured to generate the first bias voltage and the second bias voltage in accordance with a reference current and a reference voltage, the bias generation network comprising a third NMOSFET, a fourth NMOSFET, a fifth NMOSFET, a first operational amplifier, and a second operational amplifier, wherein:
   the reference current injects into a drain of the third NMOSFET;
   the first operational amplifier outputs the first bias voltage to control both a gate of the third NMOSFET and a gate of the fourth NMOSFET in accordance with a voltage difference between the drain of the third NMOSFET and either a drain of the fourth NMOSFET or the reference voltage;
   the fifth NMOSFET is stacked upon the fourth NMOSFET in the same way as that the second NMOSFET is stacked upon the first NMOSFET;
   the second operational amplifier outputs the second bias voltage to control a gate of the fifth NMOSFET in accordance with a voltage difference between the reference voltage and the drain of the fourth NMOSFET; and
   a drain of the fifth NMOSFET connects to the power supply node,
   wherein the third NMOSFET and the fourth NMOSFET are configured as a current mirror.

2. The RF amplifier of claim 1, wherein the bias generation network further comprises a compensation capacitor coupled to the gate of the third NMOSFET to stabilize the first operational amplifier.

3. The RF amplifier of claim 1, wherein a width-to-length ratio of the fourth NMOSFET is scaled from a width-to-length ratio of the third NMOSFET by a first scaling factor.

4. The RF amplifier of claim 3, wherein a width-to-length ratio of the first NMOSFET is scaled from the width-to-length ratio of the fourth NMOSFET by a second scaling factor, and a width-to-length ratio of the second NMOSFET is scaled from a width-to-length ratio of the fifth NMOSFET by the second scaling factor.

5. The RF amplifier of claim 1 further comprising an AC (alternate current) coupling network comprising a capacitor configured to couple a first node to a second node and a resistor configured to couple the first bias voltage to the second node, to which a gate of the first NMOSFET is connected.

6. The RF amplifier of claim 1 further comprising a load capacitor connected to the load inductor in parallel.

7. A method comprising:
incorporating a first NMOSFET (n-channel metal oxide semiconductor field effect transistor) as a common-source amplifier;
incorporating a second NMOSFET as a cascode device stacked upon the first NMOSFET, wherein a source of the second NMOSFET connects to a drain of the first NMOSFET and a drain of the second NMOSFET connects to a power supply node via a load inductor;
injecting a reference current into a drain of a third NMOSFET;
using a first operational amplifier to generate a first bias voltage to control a gate of the first NMOSFET, a gate of the third NMOSFET, and a gate of a fourth NMOSFET in accordance with a voltage difference between the drain of the third NMOSFET and either a drain of the fourth NMOSFET or a reference voltage;
incorporating a fifth NMOSFET stacked upon the fourth NMOSFET, wherein a source of the fifth NMOSFET connects to the drain of the fourth NMOSFET and a drain of the fifth NMOSFET connects to the power supply node; and
using a second operational amplifier to generate a second bias voltage to control both a gate of the second NMOSFET and a gate of the fifth NMOSFET in accordance with a voltage difference between the reference voltage and the drain of the fourth NMOSFET.

8. The method of claim 7 further comprising incorporating a compensation capacitor coupled to the gate of the third NMOSFET to stabilize the first operational amplifier.

9. The method of claim 7, wherein a width-to-length ratio of the fourth NMOSFET is scaled from a width-to-length ratio of the third NMOSFET by a first scaling factor.

10. The method of claim 9, wherein a width-to-length ratio of the first NMOSFET is scaled from the width-to-length ratio of the fourth NMOSFET by a second scaling factor, and a width-to-length ratio of the second NMOSFET is scaled from a width-to-length ratio of the fifth NMOSFET by the second scaling factor.

11. The method of claim 7 further comprising using an AC (alternate current) coupling capacitor configured to couple a first node to a second node and a resistor configured to couple the first bias voltage to the second node, to which a gate of the first NMOSFET is connected.

12. The method of claim 7 further comprising incorporating a load capacitor connected to the load inductor in parallel.

13. A method comprising:
incorporating a cascode amplifier comprising a second NMOSFET stacked upon a first NMOSFET;
incorporating a fifth NMOSFET stacked upon a fourth NMOSFET in the same way as the second NMOSFET is stacked upon the first NMOSFET;
injecting a reference current into a drain of a third NMOSFET;
configuring the third NMOSFET and the fourth NMOSFET to be a current mirror by using a first bias voltage to control both a gate of the third NMOSFET and a gate of the fourth NMOSFET;
establishing the first bias voltage in accordance with a voltage difference between the drain of the third NMOSFET and either a drain of the fourth NMOSFET or a reference voltage using a first operational amplifier;
establishing a second bias voltage to control a gate of the fifth NMOSFET in accordance with a voltage difference between the reference voltage and the drain of the fourth NMOSFET;
using the first bias voltage to control a gate of the first NMOSFET;
using the second bias voltage to control of a gate of the second NMOSFET;
connecting a drain of the fifth NMOSFET to a power supply node; and
connecting a drain of the second NMOSFET to the power supply node via a load inductor.

* * * * *